(12) United States Patent
Zha

(10) Patent No.: US 11,930,683 B2
(45) Date of Patent: Mar. 12, 2024

(54) COLOR FILTER LAYER AND DISPLAY DEVICE

(71) Applicant: TCL CHINA STAR OPTOELECTRONICS TECHNOLOGY CO., LTD., Guangdong (CN)

(72) Inventor: Bao Zha, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 709 days.

(21) Appl. No.: 17/053,160

(22) PCT Filed: Sep. 4, 2020

(86) PCT No.: PCT/CN2020/113465
§ 371 (c)(1),
(2) Date: Nov. 5, 2020

(87) PCT Pub. No.: WO2022/032764
PCT Pub. Date: Feb. 17, 2022

(65) Prior Publication Data
US 2022/0045131 A1     Feb. 10, 2022

(30) Foreign Application Priority Data

Aug. 10, 2020   (CN) .......................... 202010796274.1

(51) Int. Cl.
*H10K 59/38*     (2023.01)
*H10K 59/122*    (2023.01)

(52) U.S. Cl.
CPC .......... *H10K 59/38* (2023.02); *H10K 59/122* (2023.02)

(58) Field of Classification Search
CPC .... H10K 59/38; H10K 59/122; H01L 33/504; H01L 33/58; H01L 25/0753; H01L 33/502; H01L 33/505; G02B 5/223
See application file for complete search history.

(56) References Cited

U.S. PATENT DOCUMENTS

| 2005/0096420 | A1* | 5/2005 | Delp | ........................ C08K 3/22 524/439 |
|---|---|---|---|---|
| 2006/0121371 | A1 | 6/2006 | Wu | |
| 2013/0255778 | A1 | 10/2013 | Okaniwa | |

(Continued)

FOREIGN PATENT DOCUMENTS

| CN | 101191797 A | | 6/2008 |
|---|---|---|---|
| CN | 102024442 A | | 4/2011 |
| CN | 102654731 A | * | 9/2012 |

(Continued)

*Primary Examiner* — Nelson Garces
(74) *Attorney, Agent, or Firm* — PV IP PC Chung; Wei Te Chung; Zhigang Ma

(57) ABSTRACT

A color filter layer and a display device are provided. A material of the color filter layer includes a dye, a polymer resin, a monomer, a photoinitiator, and a solvent. A material of the dye is one of a core-shell material or a titanium dioxide material. The shell material includes an organic polymer, and the core material is an inorganic fluorescent material. The shell material covers the core material, and the inorganic fluorescent material includes a europium-doped compound.

19 Claims, 1 Drawing Sheet

(56) References Cited

U.S. PATENT DOCUMENTS

2017/0183304 A1\* 6/2017 Miyazaki ............... C09J 175/04

FOREIGN PATENT DOCUMENTS

| CN | 102654731 A | 9/2012 |
|---|---|---|
| CN | 103237865 A | 8/2013 |
| CN | 103917000 A | 7/2014 |
| CN | 103943661 A | 7/2014 |
| CN | 105567221 A | 5/2016 |
| CN | 110869452 A | 3/2020 |
| CN | 111312751 A | 6/2020 |
| JP | 2001216895 A | 8/2001 |

\* cited by examiner

COLOR FILTER LAYER AND DISPLAY DEVICE

FIELD OF INVENTION

The present disclosure relates to the field of display technology, and specifically, to a color filter layer and a display device.

BACKGROUND OF INVENTION

Currently, organic light-emitting diodes (OLED) and micro-light-emitting diodes (Micro-LED) are generally employed to be a backlight, which is applied to display devices. However, OLED devices and Micro-LED devices still have problems about low contrast and poor image quality. Additionally, with improvement of resolution, transfer printing of three-color LED lamps is employed, and a large number of the transferred LEDs further affect yield and repairment of the transfer printing. Moreover, as spaces between LEDs become small, a problem about optical crosstalk exists between three primary colors RGB in the display devices, thus causing the low yield of the transfer printing and low light efficiency of the display devices, and affecting display image quality of the display devices.

SUMMARY OF INVENTION

Technical Problem

The present disclosure provides a color filter layer and a display device to prevent a problem about optical crosstalk between three primary colors RGB, and to improve light efficiency and display image quality of the display device.

Technical Solutions

The present disclosure provides a color filter layer, and a material of the color filter layer includes a dye, a polymer resin, a monomer, a photoinitiator, and a solvent. A material of the dye is one of a core-shell material or a titanium dioxide material, the shell material includes an organic polymer, and the core material is an inorganic fluorescent material. The shell material covers the core material, and the inorganic fluorescent material includes a europium-doped compound.

In the color filter layer provided by the present disclosure, mass percentages of the dye: the polymer resin: the monomer: the photoinitiator: the solvent are (5%-12.5%):(4.7%-12%):(5%-24%):(0.2%-1%):(50%-85%), respectively.

In the color filter layer provided by the present disclosure, the europium-doped compound is a trivalent europium-doped compound.

In the color filter layer provided by the present disclosure, the europium-doped compound is a divalent europium-doped compound.

In the color filter layer provided by the present disclosure, the trivalent europium-doped compound includes one of $Y_2O_3:Eu^{3+}$, $YVO_4:Eu^{3+}$, $CaTiO_3:Eu^{3+}$, $YPO_4:Eu^{3+}$, $Ca_2ZnWO_6:Eu^{3+}$, $LaPO_4:Eu^{3+}$, $GdAlO_3:Eu^{3+}$, or $Ba_2CaZn_2Si_6O_{17}:Eu^{3+}$, or a combination thereof.

In the color filter layer provided by the present disclosure, the divalent europium-doped compound includes one of $Ca_{2-x}Sr_xSiO_4:Eu^{2+}$, $SrBaSiO_4:Eu^{2+}$, $Ca_{15}(PO_4)_2(SiO_4)_6:Eu^{2+}$, $M_2SiO_4:Eu^{2+}$, $Ba_2CaZn_2Si_6O_{17}:Eu^{2+}$, $Sr_{3.5}Mg_{0.5}Si_3O_8C_{14}:Eu^{2+}$, $Ca_3SiO_4Cl_2:Eu^{2+}$, $Ba_3Si_6O_9N_4:Eu^{2+}$, $Ba_3Si_6O_{12}N_2:Eu^{2+}$, $Ba_2LiSi_7AlN_{12}:Eu^{2+}$, or $SrSi_2O_2N_2:Eu^{2+}$, or a combination thereof, wherein M is one of Ca, Sr, or Br, and 0≤x≤2.

In the color filter layer provided by the present disclosure, the organic polymer includes one of styrene, polystyrene, polymethyl methacrylate, polyvinyl chloride, polyether, polyester, polyamide, or polyurethane, or a combination thereof.

In the color filter layer provided by the present disclosure, the photoinitiator includes one of acetophenone, benzoin, benzophenone, thioxanthone, triazine, anthraquinone, borate, carbazole, or imidazole photoinitiators, or a combination thereof.

The present disclosure further provides a display device. The display device includes:
- an array substrate including a first surface and a second surface configured to correspond to the first surface; and
- a color filter substrate including a third surface and a fourth surface configured to correspond to the third surface, wherein the second surface is aligned with and attached to the fourth surface;
- wherein the color filter substrate includes a color filter layer, and a material of the color filter layer includes a dye, a polymer resin, a monomer, a photoinitiator, and a solvent;
- wherein a material of the dye is one of a core-shell material or a titanium dioxide material, the shell material includes an organic polymer, and the core material is an inorganic fluorescent material;
- wherein the shell material covers the core material, and the inorganic fluorescent material includes a europium-doped compound; and
- wherein the color filter layer includes a first light conversion portion, a second light conversion portion, and a light diffusion portion repeatedly arranged in sequence, the first light conversion portion is one of a red light conversion material or a green light conversion material, the second light conversion portion is the other one of the red light conversion material or the green light conversion material, the light diffusion portion is the titanium dioxide material, and the red light conversion material and the green light conversion material are the inorganic fluorescent material.

In the display device provided by the present disclosure, the color filter substrate includes a first pixel definition layer including a plurality of first through holes, the color filter layer is disposed in the first through holes, and the first pixel definition layer is a black pixel definition layer.

In the display device provided by the present disclosure, the array substrate includes a second pixel definition layer and light emitting layers, the second pixel definition layer includes a plurality of second through holes, the light emitting layers are disposed in the second through holes, and the light emitting layers are blue light emitting diodes.

In the display device provided by the present disclosure, the second pixel definition layer is a white pixel definition layer.

In the display device provided by the present disclosure, mass percentages of the dye: the polymer resin: the monomer: the photoinitiator: the solvent are (5%-12.5%):(4.7%-12%):(5%-24%):(0.2%-1%):(50%-85%), respectively.

In the display device provided by the present disclosure, the europium-doped compound is a trivalent europium-doped compound.

In the display device provided by the present disclosure, the europium-doped compound is a divalent europium-doped compound.

In the display device provided by the present disclosure, the trivalent europium-doped compound includes one of $Y_2O_3:Eu^{3+}$, $YVO_4:Eu^{3+}$, $CaTiO_3:Eu^{3+}$, $YPO_4:Eu^{3+}$, $Ca_2ZnWO_6:Eu^{3+}$, $LaPO_4:Eu^{3+}$, $GdAlO_3:Eu^{3+}$, or $Ba_2CaZn_2Si_6O_{17}:Eu^{3+}$, or a combination thereof.

In the display device provided by the present disclosure, the divalent europium-doped compound includes one of $Ca_{2-x}Sr_xSiO_4:Eu^{2+}$, $SrBaSiO_4:Eu^{2+}$, $Ca_{15}(PO_4)_2(SiO_4)_6:Eu^{2+}$, $M_2SiO_4:Eu^{2+}$, $Ba_2CaZn_2Si_6O_{17}:Eu^{2+}$, $Sr_{3.5}Mg_{0.5}Si_3O_8C_{14}:Eu^{2+}$, $Ca_3SiO_4Cl_2:Eu^{2+}$, $Ba_3Si_6O_9N_4:Eu^{2+}$, $Ba_3Si_6O_{12}N_2:Eu^{2+}$, $Ba_2LiSi_7AlN_{12}:Eu^{2+}$, or $SrSi_2O_2N_2:Eu^{2+}$, or a combination thereof, wherein M is one of Ca, Sr, or Br, and $0 \leq x \leq 2$.

In the display device provided by the present disclosure, the organic polymer includes one of styrene, polystyrene, polymethyl methacrylate, polyvinyl chloride, polyether, polyester, polyamide, or polyurethane, or a combination thereof.

In the display device provided by the present disclosure, the photoinitiator includes one of acetophenone, benzoin, benzophenone, thioxanthone, triazine, anthraquinone, borate, carbazole, or imidazole photoinitiators, or a combination thereof.

In the display device provided by the present disclosure, the solvent includes one of propylenedione methyl ether acetate, propylene glycol diacetate, ethyl 3-ethoxypropionate, 3-ethoxy-3-imine propionate, 2-heptane, 3-heptane, cyclopentanone, or cyclohexanone, or a combination thereof.

Advantageous Effects

The present disclosure provides a color filter layer and a display device. The material of the color filter layer includes the dye, the polymer resin, the monomer, the photoinitiator, and the solvent. The material of the dye is one of the core-shell material or the titanium dioxide material, the shell material includes the organic polymer, and the core material is the inorganic fluorescent material. The shell material covers the core material, and the inorganic fluorescent material includes the europium-doped compound. Since the organic polymer covers the inorganic fluorescent material, and the color filter layer is made of the titanium dioxide material, the optical crosstalk between the three primary colors is prevented, thus improving the image quality of the display device.

DESCRIPTION OF DRAWINGS

In order to clearly illustrate technical solutions in the present disclosure, the drawings required for using in the description of the embodiments is briefly described below. Obviously, the drawings in the following description are only some of the embodiments of the present disclosure. For those skilled in the art, other drawings may also be obtained in accordance with these drawings without making for creative efforts.

DETAILED DESCRIPTION OF PREFERRED EMBODIMENTS

In combination with accompanying drawings in embodiments of the present disclosure below, technical solutions in the embodiments of the present disclosure are clearly and completely described. Obviously, the described embodiments are merely a part of the embodiments of the present disclosure, rather than all the embodiments. Based on the embodiments in the present disclosure, all of other embodiments obtained by those skilled in the art without making for creative efforts belong to the scope protected by the present disclosure.

Figure 1:
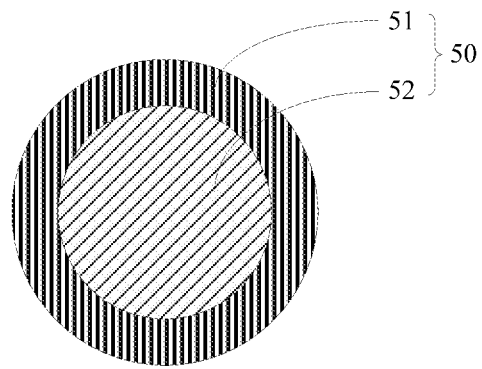
FIG. 1 is a structural sectional view of a core-shell material provided by the present disclosure.

Referring to FIG. 1, FIG. 1 is a structural sectional view of a core-shell material provided by the present disclosure. The present disclosure provides a color filter layer 210. A material of the color filter layer 210 includes a dye, a polymer resin, a monomer, a photoinitiator, and a solvent. A material of the dye is one of a core-shell material 50 or a titanium dioxide material. When the material of the dye is the titanium dioxide material, the color filter layer 210 made of the material of the color filter layer has a light diffusion effect. The shell material 51 includes an organic polymer, and the core material 52 is an inorganic fluorescent material. The shell material covers the core material. The inorganic fluorescent material includes a europium-doped compound. The core-shell material 50 is formed in a dispersant. The dispersant is dodecylbenzenesulfonic acid. Mass percentages of the dye: the polymer resin: the monomer: the photoinitiator: the solvent are (5%-12.5%):(4.7%-12%):(5%-24%):(0.2%-1%):(50%-85%), respectively. Specifically, the mass percentage of the dye may be 10%, 11%, or 7%, the mass percentage of the polymer resin may be 8%, 6%, or 11%, the mass percentage of the monomer may be 20%, 23%, or 7%, the mass percentage of the photoinitiator may be 0.5%, 0.8%, or 0.3%, and the mass percentage of the solvent may be 61.1%, 59%, or 74.3%.

In an embodiment, the europium-doped compound is a trivalent europium-doped compound. When the dye is the trivalent europium-doped compound, the color filter layer 210 emits red light. The trivalent europium-doped compound includes one of $Y_2O_3:Eu^{3+}$, $YVO_4:Eu^{3+}$, $CaTiO_3:Eu^{3+}$, $YPO_4:Eu^{3+}$, $Ca_2ZnWO_6:Eu^{3+}$, $LaPO_4:Eu^{3+}$, $GdAlO_3:Eu^{3+}$, or $Ba_2CaZn_2Si_6O_{17}:Eu^{3+}$, or a combination thereof.

In another embodiment, the europium-doped compound is a divalent europium-doped compound. When the dye is the divalent europium-doped compound, the color filter layer 210 emits green light. The divalent europium-doped compound includes one of $Ca_{2-x}Sr_xSiO_4:Eu^{2+}$, $SrBaSiO_4:Eu^{2+}$, $Ca_{15}(PO_4)_2(SiO_4)_6:Eu^{2+}$, $M_2SiO_4:Eu^{2+}$, $Ba_2CaZn_2Si_6O_{17}:Eu^{2+}$, $Sr_{3.5}Mg_{0.5}Si_3O_8C_{14}:Eu^{2+}$, $Ca_3SiO_4Cl_2:Eu^{2+}$, $Ba_3Si_6O_9N_4:Eu^{2+}$, $Ba_3Si_6O_{12}N_2:Eu^{2+}$, $Ba_2LiSi_7AlN_{12}:Eu^{2+}$, or $SrSi_2O_2N_2:Eu^{2+}$, or a combination thereof, wherein M is one of Ca, Sr, or Br, and $0 \leq x \leq 2$.

In an embodiment, the organic polymer includes one of styrene, polystyrene, polymethyl methacrylate, polyvinyl chloride, polyether, polyester, polyamide, or polyurethane, or a combination thereof.

In an embodiment, the polymer resin may be acrylic resin.

In an embodiment, the photoinitiator includes one of acetophenone, benzoin, benzophenone, thioxanthone, triazine, anthraquinone, borate, carbazole, or imidazole photoinitiators, or a combination thereof.

In an embodiment, the solvent includes one of propylenedione methyl ether acetate, propylene glycol diacetate, ethyl 3-ethoxypropionate, 3-ethoxy-3-imine propionate, 2-heptane, 3-heptane, cyclopentanone, or cyclohexanone, or a combination thereof.

The present disclosure provides a color filter layer. The material of the dye is dispersed in a mixture of the polymer resin, the monomer, the photoinitiator, and the solvent to form the material of the color filter layer, and the material of the dye is one of the core-shell material or the titanium dioxide material. By employing the material of the color filter layer composed of the core-shell material formed by the core material covered by the shell material, light stability and thermal stability are enhanced. Moreover, the titanium dioxide material is dispersed in the mixture of the polymer resin, the monomer, the photoinitiator, and the solvent to form the material of the color filter layer, thus having a scattering effect. When blue light passes, the scattering of the blue light is increased, thereby increasing a visual angle of the blue light.

Figure 2:
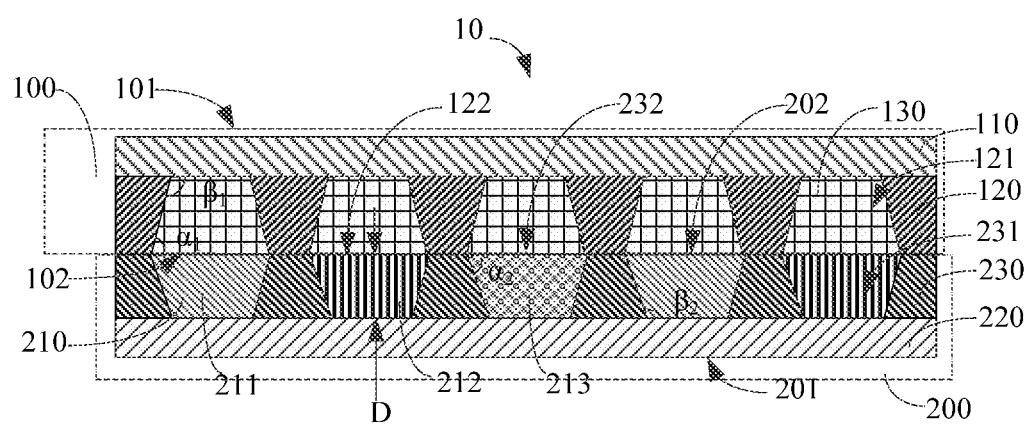
FIG. 2 is a structural sectional view of a display device provided by the present disclosure.

Referring to FIG. 2, FIG. 2 is a structural sectional view of a display device provided by the present disclosure. The present disclosure further provides a display device 10. The display device 10 includes an array substrate 100 and a color filter substrate 200.

The array substrate 100 includes a first surface 101 and a second surface 102 configured to correspond to the first surface. The array substrate 100 includes a first base substrate 110, a second pixel definition layer 120, and light emitting layers 130. The second pixel definition layer 120 is located on the first base substrate 110. The second pixel definition layer 120 is a white pixel definition layer, and includes a plurality of second through holes 121. The second through holes 121 penetrate the second pixel definition layer 120 to expose the first base substrate 110. Each of the second through holes 121 includes an angle $\beta_1$ and an angle $\alpha_1$. The angle $\beta_1$ is an included angle between the second pixel definition layer 120 and the first base substrate 110. A degree of the angle $\beta_1$ ranges from 100 degrees to 179 degrees. The second through holes 121 includes a first upper surface 122. The first upper surface 122 is located on a side away from the first base substrate 110. The angle $\alpha_1$ is an included angle between the first upper surface 122 and the second pixel definition layer 120. A degree of the angle $\alpha_1$ ranges from 10 degrees to 80 degrees. The light emitting layers 130 are disposed in the second through holes 121, and the light emitting layers 130 are blue light emitting diodes. Specifically, the light emitting layers 130 are blue micro-light-emitting diodes or active mini-light-emitting diodes.

In the present disclosure, the second pixel definition layer employs the white pixel definition layer, the degree of the angle $\beta_1$ is defined as 100 degrees to 179 degrees, and the degree of the angle $\alpha_1$ is defined as 10 degrees to 80 degrees, thus increasing reflectance of the blue light and improving the light efficiency. Moreover, the transfer printing of the second pixel definition layer 120 employs the blue light-emitting diodes. Since the single light-emitting diode employs monochromatic transfer printing, yield of the transfer printing of the monochromatic transfer printing is greater than that of trichromatic or multichromatic transfer printing, and a repair cost of the monochromatic transfer printing is less than that of the trichromatic or multichromatic transfer printing.

The color filter substrate 200 includes a third surface 201 and a fourth surface 202 configured to correspond to the third surface. The second surface 102 is aligned with and attached to the fourth surface 202. The color filter substrate 200 includes a second base substrate 220, a first pixel definition layer 230, and a color filter layer 210. The first pixel definition layer 230 is disposed on the second base substrate 220. The first pixel definition layer 230 is a black pixel definition layer. The first pixel definition layer 230 includes a plurality of first through holes 231. The first through holes 231 penetrate the first pixel definition layer 230 to expose the second base substrate 220. The first through holes 231 includes an angle $\beta_2$ and an angle $\alpha_2$. The angle 132 is an included angle between the first pixel definition layer 230 and the second base substrate 220. A degree of the angle $\beta_2$ ranges from 100 degrees to 179 degrees. The first through holes 231 includes a second upper surface 232. The second upper surface 232 is located on a side away from the second base substrate 220. The angle $\alpha_2$ is an included angle between the second upper surface 232 and the first pixel definition layer 230. A degree of the angle $\alpha_2$ ranges from 10 degrees to 80 degrees. The color filter layer 210 is disposed in the first through holes 231. A thickness D of the color filter layer 210 ranges from 0.5 µm to 2 µm. The color filter layer 210 is the color filter layer 210 provided by the present disclosure. The color filter layer 210 includes a first light conversion portion 211, a second light conversion portion 212, and a light diffusion portion 213 repeatedly arranged in sequence. The first light conversion portion 211 is one of a red light conversion material or a green light conversion material, and the second light conversion portion 212 is the other one of the red light conversion material or the green light conversion material. The light diffusion portion 213 is the titanium dioxide material. A material of the light diffusion portion 213 further includes the polymer resin, the monomer, the photoinitiator, and the solvent. The red light conversion material and the green light conversion material are the inorganic fluorescent material. The inorganic fluorescent material is covered by the organic polymer. Specifically, the inorganic fluorescent material is the divalent europium-doped compound or the trivalent europium-doped compound. Specifically, the red light conversion material includes the trivalent europium-doped compound covered by the organic polymer, the polymer resin, the monomer, the photoinitiator, and the solvent, and the green light conversion material includes the divalent europium-doped compound covered by the organic polymer, the polymer resin, the monomer, the photoinitiator, and the solvent.

In the present disclosure, since the red light conversion material employs the trivalent europium-doped compound covered by the organic polymer, and the green light conversion material employs the divalent europium-doped compound covered by the organic polymer, the light stability and the thermal stability are enhanced, thereby improving the light efficiency and ensuring the display image quality of the display device. Since the light diffusion portion employs the titanium dioxide material, the light diffusion portion has the scattering effect, thereby increasing the visual angle of the blue light. Since the first pixel definition layer employs the black pixel definition layer, the crosstalk caused by light mixing between the RGB is prevented, thereby improving the display image quality of the display device.

The present disclosure provides a color filter layer and a display device. The material of the color filter layer includes the dye, the polymer resin, the monomer, the photoinitiator, and the solvent. The material of the dye is one of the core-shell material or the titanium dioxide material, the shell material includes the organic polymer, and the core material is the inorganic fluorescent material. The shell material covers the core material, and the inorganic fluorescent material includes the europium-doped compound. Since the organic polymer covers the inorganic fluorescent material, and the color filter layer is made of the titanium dioxide material, the optical crosstalk between the three primary colors is prevented, thus improving the image quality and the light efficiency of the display device.

The embodiments of the present disclosure are introduced in detail above. Specific examples herein are used to set forth the principles and the implementation of the present disclosure. The illustration of the foregoing embodiments is only used to facilitate understanding the present disclosure. Moreover, for those skilled in the art, both of the specific embodiments and the application scope can still be modified in accordance with the idea of the present disclosure. In summary, the content of the specification should not be construed as the limitation to the present disclosure.

What is claimed is:

1. A color filter layer, comprising: a material of the color filter layer including a dye, a polymer resin, a monomer, a photoinitiator, and a solvent;
wherein a material of the dye is one of a core-shell material or a titanium dioxide material, the shell material includes an organic polymer, and the core material is an inorganic fluorescent material;
wherein the shell material covers the core material, and the inorganic fluorescent material includes a europium-doped compound; and
wherein the europium-doped compound is a trivalent europium-doped compound.

2. The color filter layer according to claim 1, wherein mass percentages of the dye: the polymer resin: the monomer: the photoinitiator: the solvent are (5%-12.5%):(4.7%-12%):(5%-24%):(0.2%-1%):(50%-85%), respectively.

3. A color filter layer, comprising: a material of the color filter layer including a dye, a polymer resin, a monomer, a photoinitiator, and a solvent;
wherein a material of the dye is one of a core-shell material or a titanium dioxide material, the shell material includes an organic polymer, and the core material is an inorganic fluorescent material;
wherein the shell material covers the core material, and the inorganic fluorescent material includes a europium-doped compound; and
wherein the europium-doped compound is a divalent europium-doped compound.

4. The color filter layer according to claim 1, wherein the trivalent europium-doped compound includes one of $Y_2O_3$:$Eu^{3+}$, $YVO_4$:$Eu^{3+}$, $CaTiO_3$:$Eu^{3+}$, $YPO_4$:$Eu^{3+}$, $Ca_2ZnWO_6$:$Eu^{3+}$, $LaPO_4$:$Eu^{3+}$, $GdAlO_3$:$Eu^{3+}$, or $Ba_2CaZn_2Si_6O_{17}$:$Eu^{3+}$, or a combination thereof.

5. The color filter layer according to claim 3, wherein the divalent europium-doped compound includes one of $Ca_{2-x}Sr_xSiO_4$:$Eu^{2+}$, $SrBaSiO_4$:$Eu^{2+}$, $Ca_{15}(PO_4)_2(SiO_4)_6$:$Eu^{2+}$, $M_2SiO_4$:$Eu^{2+}$, $Ba_2CaZn_2Si_6O_{17}$:$Eu^{2+}$, $Sr_{3.5}Mg_{0.5}Si_3O_8Cl_4$:$Eu^{2+}$, $Ca_3SiO_4Cl_2$:$Eu^{2+}$, $Ba_3Si_6O_9N_4$:$Eu^{2+}$, $Ba_3Si_6O_{12}N_2$:$Eu^{2+}$, $Ba_2LiSi_7AlN_{12}$:$Eu^{2+}$, or $SrSi_2O_2N_2$:$Eu^{2+}$, or a combination thereof, wherein M is one of Ca, Sr, or Br, and $0 \leq x \leq 2$.

6. The color filter layer according to claim 1, wherein the organic polymer includes one of styrene, polystyrene, polymethyl methacrylate, polyvinyl chloride, polyether, polyester, polyamide, or polyurethane, or a combination thereof.

7. The color filter layer according to claim 1, wherein the photoinitiator includes one of acetophenone, benzoin, benzophenone, thioxanthone, triazine, anthraquinone, borate, carbazole, or imidazole photoinitiators, or a combination thereof.

8. A display device, comprising:
an array substrate including a first surface and a second surface configured to correspond to the first surface; and
a color filter substrate including a third surface and a fourth surface configured to correspond to the third surface, wherein the second surface is aligned with and attached to the fourth surface;
wherein the color filter substrate includes a color filter layer, and a material of the color filter layer includes a dye, a polymer resin, a monomer, a photoinitiator, and a solvent;
wherein a material of the dye is one of a core-shell material or a titanium dioxide material, the shell material includes an organic polymer, and the core material is an inorganic fluorescent material;
wherein the shell material covers the core material, and the inorganic fluorescent material includes a europium-doped compound; and
wherein the color filter layer includes a first light conversion portion, a second light conversion portion, and a light diffusion portion repeatedly arranged in sequence, the first light conversion portion is one of a red light conversion material or a green light conversion material, the second light conversion portion is the other one of the red light conversion material or the green light conversion material, the light diffusion portion is the titanium dioxide material, and the red light conversion material and the green light conversion material are the inorganic fluorescent material.

9. The display device according to claim 8, wherein the color filter substrate includes a first pixel definition layer including a plurality of first through holes, the color filter layer is disposed in the first through holes, and the first pixel definition layer is a black pixel definition layer.

10. The display device according to claim 9, wherein the array substrate includes a second pixel definition layer and light emitting layers, the second pixel definition layer includes a plurality of second through holes, the light emitting layers are disposed in the second through holes, and the light emitting layers are blue light emitting diodes.

11. The display device according to claim 10, wherein the second pixel definition layer is a white pixel definition layer.

12. The display device according to claim 8, wherein mass percentages of the dye: the polymer resin: the monomer: the photoinitiator: the solvent are (5%-12.5%):(4.7%-12%):(5%-24%):(0.2%-1%):(50%-85%), respectively.

13. The display device according to claim 8, wherein the europium-doped compound is a trivalent europium-doped compound.

14. The display device according to claim 8, wherein the europium-doped compound is a divalent europium-doped compound.

15. The display device according to claim 13, wherein the trivalent europium-doped compound includes one of $Y_2O_3$:$Eu^{3+}$, $YVO_4$:$Eu^{3+}$, $CaTiO_3$:$Eu^{3+}$, $YPO_4$:$Eu^{3+}$, $Ca_2ZnWO_6$:$Eu^{3+}$, $LaPO_4$:$Eu^{3+}$, $GdAlO_3$:$Eu^{3+}$, or $Ba_2CaZn_2Si_6O_{17}$:$Eu^{3+}$, or a combination thereof.

16. The display device according to claim 14, wherein the divalent europium-doped compound includes one of $Ca_{2-x}Sr_xSiO_4$:$Eu^{2+}$, $SrBaSiO_4$:$Eu^{2+}$, $Ca_{15}(PO_4)_2(SiO_4)_6$:$Eu^{2+}$, $M_2SiO_4$:$Eu^{2+}$, $Ba_2CaZn_2Si_6O_{17}$:$Eu^{2+}$, $Sr_{3.5}Mg_{0.5}Si_3O_8Cl_4$:$Eu^{2+}$, $Ca_3SiO_4Cl_2$:$Eu^{2+}$, $Ba_3Si_6O_9N_4$:$Eu^{2+}$, $Ba_3Si_6O_{12}N_2$:$Eu^{2+}$, $Ba_2LiSi_7AlN_{12}$:$Eu^{2+}$, or $SrSi_2O_2N_2$:$Eu^{2+}$, or a combination thereof, wherein M is one of Ca, Sr, or Br, and $0 \leq x \leq 2$.

17. The display device according to claim 9, wherein the organic polymer includes one of styrene, polystyrene, polymethyl methacrylate, polyvinyl chloride, polyether, polyester, polyamide, or polyurethane, or a combination thereof.

18. The display device according to claim 8, wherein the photoinitiator includes one of acetophenone, benzoin, benzophenone, thioxanthone, triazine, anthraquinone, borate, carbazole, or imidazole photoinitiators, or a combination thereof.

19. The display device according to claim 8, wherein the solvent includes one of propylenedione methyl ether acetate, propylene glycol diacetate, ethyl 3-ethoxypropionate, 3-ethoxy-3-imine propionate, 2-heptane, 3-heptane, cyclopentanone, or cyclohexanone, or a combination thereof.

* * * * *